United States Patent [19]
Sakaguchi et al.

[11] Patent Number: 5,856,229
[45] Date of Patent: Jan. 5, 1999

[54] PROCESS FOR PRODUCTION OF SEMICONDUCTOR SUBSTRATE

[75] Inventors: Kiyofumi Sakaguchi, Isehara; Takao Yonehara, Atsugi, both of Japan

[73] Assignee: Canon Kabushiki Kaisha, Tokyo, Japan

[21] Appl. No.: 863,717

[22] Filed: May 27, 1997

Related U.S. Application Data

[63] Continuation of Ser. No. 401,237, Mar. 9, 1995, abandoned.

[30] Foreign Application Priority Data

Mar. 10, 1994 [JP] Japan .................................. 6-039389
Mar. 6, 1995 [JP] Japan .................................. 7-045441

[51] Int. Cl.$^6$ .................................................. H01L 21/76
[52] U.S. Cl. .......................... 438/406; 438/409; 438/466; 438/459; 438/759; 438/977; 438/960
[58] Field of Search .................................... 438/406, 409, 438/466, 459, 759, 977, 222, 330, 485, 107, 960

[56] References Cited

U.S. PATENT DOCUMENTS

| | | |
|---|---|---|
| 4,116,751 | 9/1978 | Zaromb .................................. 156/600 |
| 4,727,047 | 2/1988 | Bozler et al. .............................. 437/89 |
| 5,277,748 | 1/1994 | Sakaguchi et al. . |
| 5,453,394 | 9/1995 | Yonehara et al. . |
| 5,466,631 | 11/1995 | Ichikawa et al. . |

FOREIGN PATENT DOCUMENTS

0469630A2  2/1992  European Pat. Off. .

OTHER PUBLICATIONS

G.W. Cullen, ed., Journal of Crystal Growth, vol. 63, No. 3, pp. 429–590, Oct. 1993 (see p. 547).

C. Harendt et al., *Silicon on Insulator Material by Wafer Bonding*, Journal of Electronic Materials, vol. 20, No. 3, pp. 267–277, Mar. 1991.

H. Baumgart et al., *Light Scattering Topography Characterization of Bonded SOI Wafers,* The Electrochemical Society, Extended Abstracts, Abstract No. 493, vol. 91–2, pp. 733–34 Oct. 1991.

C. Hunt et al., *Thinning of Bonded Wafers: Etch–Stop Approaches,* The Electrochemical Society, Extended Abstracts, Abstract No. 471, vol. 91–2, pp. 696–97, Oct. 1991.

A. Uhlir, Jr., *Electrolytic Shaping of Germanium and Silicon,* The Bell System Technical Journal, vol. XXXV, pp. 333–347, Mar. 1956.

R.P. Holmstrom, *Complete dielectric isolation by highly selective and self–stopping formation of oxidized porous silicon,* Applied Physics Letters, vol. 42, No. 4, pp. 386–388, Feb. 1983.

T. Unagami, *Formation Mechanism of Porous Silicon Layer by Anodization in HF Solution,* Journal of the Electrochemical Society, vol. 127, No. 2, pp. 476–483, Feb. 1980.

K. Imai, *A New Dielectric Isolation Method Using Porous Silicon,* Solid State Electronics, vol. 24, pp. 159–164, 1981.

*Primary Examiner*—George Fourson
*Attorney, Agent, or Firm*—Fitzpatrick, Cella, Harper & Scinto

[57] ABSTRACT

A process for producing a semiconductor substrate is provided which comprises steps of forming a porous layer on a first substrate, forming a nonporous monocrystalline semiconductor layer on the porous layer of the first substrate, bonding the nonporous monocrystalline layer onto a second substrate, separating the bonded substrates at the porous layer, removing the porous layer on the second substrate, and removing the porous layer constituting the first substrate.

24 Claims, 5 Drawing Sheets

PROCESS FOR PRODUCTION OF SEMICONDUCTOR SUBSTRATE

This application is a continuation of application Ser. No. 08/401,237 filed Mar. 9, 1995, now abandoned.

BACKGROUND OF THE INVENTION

1. Field of the Invention

The present invention relates to a process for producing a semiconductor substrate. More specifically, the present invention relates to a process for producing a monocrystalline semiconductor on a dielectric-isolated or insulative material, or a monocrystalline compound semiconductor on a semiconductor substrate. Further the present invention relates to a process for producing an electronic device or an integrated circuit formed on a single crystalline semiconductor layer.

2. Related Background Art

The technique of formation of monocrystalline Si (silicon) semiconductor on an insulative material is well known as silicon-on-insulator (SOI) technique. A device prepared by the SOI technique has various advantages which are not achievable by a bulk Si substrate in usual Si integrated circuits, as noted below:

1. Ease of dielectric isolation, and possibility of high degree of integration'
2. High resistance against radioactive ray;
3. Low floating capacity, and the possibility of high speed operation;
4. The welling process is unnecessary;
5. Preventability of latch-up; and
6. Possibility of producing a complete depletion type field-effect transistor to name a few.

The process of forming the SOI structure has been actively studied for several decades. The results of the studies are summarized, for example, in the paper: Special Issue; "Single-crystal silicon on non-single-crystal insulators"; edited by G. W. Cullen, Journal of Crystal Growth; Vol.63, No.3, pp.429–590 (1983).

SOS (silicon on sapphire) is known and is produced by heteroepitaxial growth of silicon on monocrystalline sapphire by CVD (chemical vapor deposition). The SOS technique, which is successful as one of SOI techniques, is limited in its application, because of many crystal defects caused by mismatch of the lattice at the interface between the Si layer and the underlying sapphire, contamination of the Si layer with aluminum from the sapphire substrate, expense of the substrate, and the difficulty of large-area substrate formation.

Recently, studies are being made to produce the SOI structure without using a sapphire substrate. The studies are classified roughly into the two processes below:

1. A first process which includes surface oxidation of a monocrystalline Si substrate, local exposure of the Si substrate by opening a window, and epitaxial growth of Si laterally from the exposed portion as the seed to form an Si layer on $SiO_2$. (Si layer deposition on $SiO_2$).
2. A second process including $SiO_2$ formation beneath a monocrystalline $SiO_2$ substrate, utilizing the $SiO_2$ substrate as the active layer. (No Si layer deposition).

The device formed on a compound semiconductor exhibits performances, such as high speed, and luminescence, which are not achievable by Si. Such types of devices are formed by epitaxial growth on a compound semiconductor substrate such as GaAs. The compound semiconductor substrate, however, has disadvantages of high cost, low mechanical strength, and difficulty in the formation of a large-area wafer. Accordingly, heteroepitaxial growth of a compound semiconductor on an Si wafer is being studied to attain low cost, high mechanical strength, and ease of production of a large-area wafer.

The above-known process 1 (Si layer deposition on $SiO_2$) includes methods of direct lateral epitaxial growth of monocrystalline Si layer by CVD; deposition of amorphous Si and subsequent heat treatment to cause solid-phase lateral epitaxial growth; melting recrystallization to grow monocrystalline layer on an $SiO_2$ by irradiation of amorphous or polycrystalline Si layer with a focused energy beam such as an electron beam and laser beam; and a zone melting recrystallization in which a bar-shaped heater is moved to scan with a belt-like melt zone. These methods respectively have advantages and disadvantages, involving problems in process controllability, productivity, product uniformity, and product quality, and are not industrialized yet. For example, the CVD method requires sacrificial oxidation, giving low crystallinity in the solid-phase growth. The beam annealing method involves problems in processing time of focused beam scanning and in controllability of beam superposition and focusing. Of the above methods, the zone melting recrystallization is the most advanced method, and is employed in relatively large scale integrated circuits. This method, however, still causes crystal defects in subgrain boundaries, and is not successful in the production of a minority carrier device.

The above known process 2 in which the Si substrate is not utilized as the seed for epitaxial growth includes the four methods below:

1. An oxidation film is formed on a monocrystalline Si substrate which has V-shaped grooves on the surface formed by anisotropical etching; a polycrystalline Si layer is deposited in a thickness approximate to that of the Si substrate on the oxidation film; and the back face of the Si substrate is ground to form a monocrystalline Si region isolated dielectrically by surrounding with the V-shaped grooves. This method involves problems in controllability and productivity in deposition of polycrystalline Si in a thickness of as large as several hundred microns, and in removal of the monocrystalline Si substrate by grinding at the back face to leave an isolated active Si layer only.
2. An $SiO_2$ layer is formed by ion implantation into a monocrystalline Si substrate (SIMOX: Separation by ion implanted oxygen). This is the most highly advanced method in view of the matching with the Si process. This method, however, requires implantation of oxygen ions in an amount of as much as $10^{18}$ ions/cm$^2$, which takes a long time, resulting in low productivity and high wafer cost. Further, the product has many remaining crystal defects, and does not have satisfactory properties for the industrial production of a minority carrier device.
3. An SOI structure is formed by oxidation of porous Si for dielectric isolation. In this method, an N-type Si layer is formed in an island-like pattern on a P-type monocrystalline Si substrate surface by proton ion implantation (Imai, et al.: J. Crystal Growth, Vol. 63, p. 547 (1983)) or by epitaxial growth and patterning, and subsequently only the P-type Si substrate is made porous by anodic oxidation in an HF solution to surround the island-patterned N-type Si, and the N-type Si island is dielectrically isolated by accelerated oxidation. In this method, the isolated Si regions are fixed prior to the device process, which may limit the freedom of device design disadvantageously.

4. Different from the above conventional SOI formation, a method has recently come to be noticed in which a monocrystalline Si substrate is bonded to another thermally oxidized monocrystalline Si substrate by heat treatment or use of an adhesive to form an SOI structure. This method requires uniform thinness of the active layer for the device: namely, formation of a film of a micron thick or thinner from a monocrystalline substrate of several hundred microns thick. This thin film may be formed by either of the two methods below.

1. Thin film formation by grinding; and
2. Thin film formation by selective etching.

The grinding method does not readily give a uniform thin film. In particular, formation of a film of submicron thickness results in thickness variation of tens of percent. This irregularity is a serious problem. With a larger diameter of the wafer, the uniformity of the thickness is much more difficult to attain.

The etching method is regarded to be effective for uniform thin film formation. This method, however, involves the problems of insufficient selectivity of about $10^2$ at the highest, inferior surface properties after etching, and low crystallinity of the SOI layer because of the employed ion implantation, epitaxial or heteroepitaxial growth on a high-concentration B-doped Si layer. (C. Harendt, et al.: J. Elect. Mater., Vol. 20, p. 267 (1991); H. Baumgart, et al.: Extended Abstract of ECS 1st International Symposium of Wafer Bonding, pp. 733 (1991); and C. E. Hunt: Extended Abstract of ECS 1st International Symposium of Wafer Bonding, pp. 696 (1991))

The semiconductor substrate which is prepared by lamination requires two wafers essentially, and a major part of one of the wafers is discarded by grinding or etching, thereby wasting the resource. Therefore, the SOI prepared by lamination involves many problems in controllability, uniformity, production cost, and so forth in conventional processes.

A thin Si layer deposited on a light-transmissive substrate typified by a glass plate becomes amorphous or polycrystalline owing to disorder of crystallinity of the substrate, not giving high performance of the device. Simple deposition of Si does not give desired quality of single crystal layer owing to the amorphous crystal structure of the substrate.

The light-transmissive substrate is essential for construction of a light-receiving element such as a contact sensor, and projection type of liquid crystal image-displaying apparatus. Additionally, a driving element of high performance is necessary for higher density, higher resolution, and higher precision of the sensor and of the image elements of the display. Consequently, the element provided on a light transmissive substrate is also required to have a monocrystalline layer of high crystallinity.

Amorphous Si or polycrystalline Si will not give a driving element having the required sufficient performance because of the many defects in the crystal structure.

As mentioned above, a compound semiconductor device requires essentially a compound semiconductor substrate. The compound semiconductor substrate, however, is expensive, and is not readily formed in a larger size.

Epitaxial growth of a compound semiconductor such as GaAs on an Si substrate gives a grown film of poor crystallinity owing to the difference in the lattice constants and the thermal expansion coefficients, thereby the resulting grown film being unsuitable for use for a device.

Epitaxial growth of a compound semiconductor on porous Si is intended for mitigation of mismatch of the lattices. However, the substrate does not have sufficient stability and reliability owing to the low thermal stability and long-term deterioration of the porous Si.

In view of the above-mentioned problems, Takao Yonehara, one of the inventors of the present invention, disclosed formerly a novel process for preparing a semiconductor member in European Patent Publication No. 0469630A2. This process comprises the steps of forming a member having a nonporous monocrystalline semiconductor region on a porous monocrystalline semiconductor region; bonding the surface of a member of which the surface is constituted of an insulating substance onto the surface of the nonporous monocrystalline semiconductor region; and then removing the porous monocrystalline semiconductor region by etching. This process is satisfactory for solving the above-mentioned problems. Further improvement of the disclosed process for higher productivity and lower production cost will contribute greatly to the industries concerned.

SUMMARY OF THE INVENTION

The present invention intends to improve further the process disclosed in the above European Patent for producing a semiconductor member.

The present invention further intends to provide a process for producing economically a semiconductor substrate having a monocrystalline layer or a compound semiconductor monocrystalline layer having excellent crystallinity, large-area and a uniform flat surface on a surface of a monocrystalline substrate, in which the substrate is removed to leave the active semiconductor layer to obtain a monocrystalline layer or a compound semiconductor monocrystalline layer formed on the surface and having few defects.

The present invention still further intends to provide a process for producing a semiconductor substrate on a transparent substrate (light-transmissive substrate) for obtaining a monocrystalline Si semiconductor layer or a monocrystalline compound semiconductor layer having crystallinity as high as that of a monocrystalline wafer with high productivity, high uniformity, high controllability, and low production cost.

The present invention still further intends to provide a process for producing a semiconductor substrate useful in place of expensive SOS or SIMOX in the production of a large scale integrated circuit of SOI structure.

A first embodiment of the process for producing a semiconductor substrate of the present invention comprises the steps of: forming a nonporous monocrystalline semiconductor layer on a porous layer of the first substrate having the porous layer; bonding the nonporous monocrystalline layer onto a second substrate; separating the bonded substrates at the porous layer; removing the porous layer on the second substrate; and removing the porous layer constituting the first substrate.

A second embodiment of the process for producing a semiconductor substrate of the present invention comprises the steps of: forming a nonporous monocrystalline semiconductor layer on a porous layer of a first substrate having the porous layer; bonding the nonporous monocrystalline layer onto a second substrate with interposition of an insulative layer; separating the bonded substrates at the porous layer; removing the porous layer on the second substrate; and removing the porous layer constituting the first substrate.

In the present invention, the lamination-bonded substrates are separated at the porous layer, and the porous layer is removed from the second substrate having a nonporous monocrystalline semiconductor layer. Thereby, a semiconductor substrate is prepared which has nonporous monocrystalline semiconductor layer of high quality. Furthermore, the first substrate can be repeatedly used for producing the semiconductor substrate in the next production cycle by removing the remaining porous layer on the first substrate after the separation of the two substrates. Thereby, the semiconductor substrate can be produced with higher productivity and lower cost.

The present invention enables preparation of a monocrystalline layer of Si or the like, or a monocrystalline compound semiconductor layer having excellent crystallinity similar to monocrystalline wafers on a substrate including a light-transmissive substrate with advantages in productivity, uniformity, controllability, and production cost.

The present invention further enables production of a semiconductor substrate which can be a substitute for expensive SOS and SIMOX in the production of large scale integrated circuits of an SOI structure.

According to the present invention, the combined substrates are separated at the porous layer or layers into two or more substrates, and the one or more separated substrates may be used as a semiconductor substrate after removal of the remaining porous layer, and the other substrate may be used repeatedly in the next production cycle of a semiconductor substrate.

Further, according to the present invention, two semiconductor substrates can be produced simultaneously by forming porous layers and nonporous layers on the e layers on the both faces of a substrate, bonding thereto two other substrates, and separating the substrates at the porous layer.

DESCRIPTION OF THE PREFERRED EMBODIMENTS

Figure 1A:
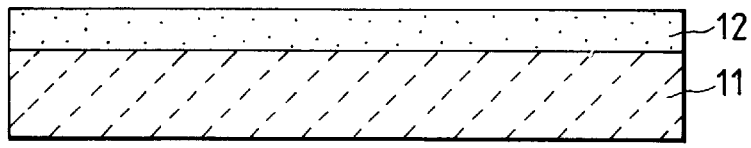
FIGS. 1A to 1E are schematic drawings for explaining an example of the process of the present invention.

The process for producing a semiconductor substrate of the present invention is described by employing a silicon substrate as an example.

The mechanical strength of porous silicon is much lower than that of bulk silicon depending on the porosity thereof. For instance, porous silicon having a porosity of 50% is considered to have half the mechanical strength of bulk silicon. Therefore, on application of a tensile force, a compressive force, or a shearing force to a laminated wafer, the porous layer will be broken first. The larger the porosity of the porous layer, the less force is needed for the breakdown of the layer.

A silicon substrate can be made porous by anodization in an HF solution. The resulting porous Si layer has a density ranging from 1.1 to 0.6 g/cm³ depending on the HF solution concentration of from 50 to 20% in comparison with the density of 2.33 g/cm³ of monocrystalline Si. The porous layer is formed only on a P-type Si substrate, but is not formed on an N-type Si layer for the reasons described later. The porous Si layer has pores of about 600 Å in average diameter according to transmissive electron microscopy.

The porous Si was found by Uhlir, et al. in the year 1956 during the study of electropolishing of semiconductors (A. Uhlir: Bell Syst. Tech. J., vol. 35, p. 333 (1956)).

Unagami, et al. found that positive holes are required for anodization of Si in an HF solution, and the reactions proceed as shown in their report on dissolution of Si in anodization (T. Unagami, et al.: J. Electrochem. Soc., vol. 127, p. 476 (1980)) as below:

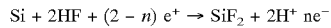

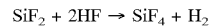

or

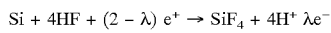

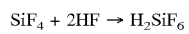

where $e_+$ and $e_-$ represent respectively a positive hole and an electron; n and λ represent respectively the number of positive holes required for dissolving one Si atom. Unagami reported that porous Si is formed under the condition of n>2, or λ>4.

According to the above consideration, P-type Si which has positive holes can be made porous, whereas N-type Si cannot be made porous. This selectivity for porosity was evidenced by Nagano, et al., and Imai (Nagano, Nakajima, Yasuno, Oonaka, and Kajihara: Denshi Tsushin Gakkai Gijutsu Kenkyu Hokoku (Technical Research Report of Electronic Communication Society) vol. 79, SSD79-9549 (1979); and K. Imai: Solid-State Electronics, vol. 24, p. 159 (1981)).

On the other hand, a report is found that high concentration N-type Si can be made porous (R. P. Holmstrom and J. Y. Chi: Appl. Phys. Lett., vol. 42, p. 386 (1983)). Therefore, selection of the substrate is important for producing porous Si regardless of P-type or N-type.

The porous Si layer has pores of about 600 Å in average diameter by observation by transmission electron microscopy, and the density is less than half that of monocrystalline Si. Nevertheless, the single crystallinity is maintained, and thereon a monocrystalline Si can be made to grow epitaxially in a layer. However, in the epitaxial growth at a temperature of 1000° C. or higher, the internal pores will come to be rearranged, which impairs the accelerated etching characteristics. Therefore, low temperature growth processes are preferred for epitaxial growth of the Si layer, such as molecular beam epitaxial growth, plasma CVD, reduced pressure CVD, photo-assisted CVD, bias sputtering, and liquid-phase epitaxial growth.

The porous layer has a large volume of voids therein, having a half or lower density of the material, and having a surface area remarkably large for the volume. Accordingly, the chemical etching is greatly accelerated in comparison with that of the normal monocrystalline layer.

Embodiment 1

Figure 1B:
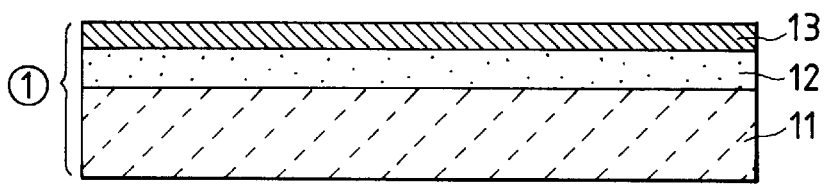

A first monocrystalline Si substrate 11 is made porous at the surface to form a porous layer 12 as shown in FIG. 1A. Then, nonporous monocrystalline Si layer 13 is formed on the porous Si layer 12 as shown in FIG. 1B.

Figure 1C:
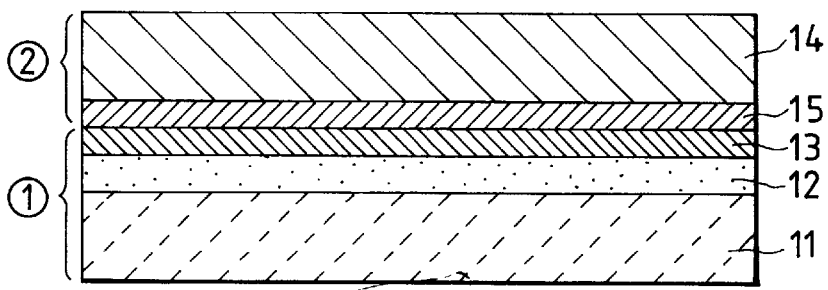

Another Si supporting substrate 14 is brought into contact with the nonporous monocrystalline Si layer 13 with interposition of an insulative layer 15 at room temperature as shown in FIG. 1C, and then the contacted matter was subjected to anode coupling, compression, heat treatment, or combination thereof to bond tightly the Si supporting substrate 14 and the monocrystalline layer 13 with interposition of the insulative layer 15. The insulative layer 15 may be formed preliminarily on either one of the monocrystalline Si layer 13 or the Si supporting substrate 14, or the three sheets may be bonded with an insulative thin film interposed.

Figure 1D:
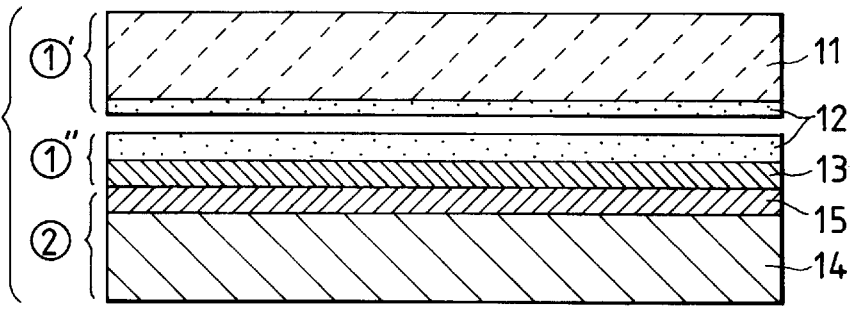

Subsequently, the substrates are separated at the porous Si layer 12 as shown in FIG. 1D. On the Si supporting substrate 14, the layers have the structure of porous Si 12/monocrystalline Si layer 13/insulative layer 15/Si supporting substrate 14.

The porous Si 12 is removed selectively by non-electrolytic wet chemical etching by use of at least one of a usual Si etching solution, hydrofluoric acid or a mixture of hydrofluoric acid with alcohol and/or hydrogen peroxide as the porous Si-selective etching solution, and buffered hydrofluoric acid or a mixture of hydrofluoric acid with alcohol and/or hydrogen peroxide to leave the thin-layered monocrystalline Si layer 13 on the insulative substrate 15 and 14. As described above in detail, the porous Si can be etched selectively by a usual Si etching solution owing to the extremely large surface area of the porous surface area.

Otherwise, the porous Si 12 is selectively removed by grinding by utilizing the monocrystalline Si layer 13 as the grinding stopper.

Figure 1E:
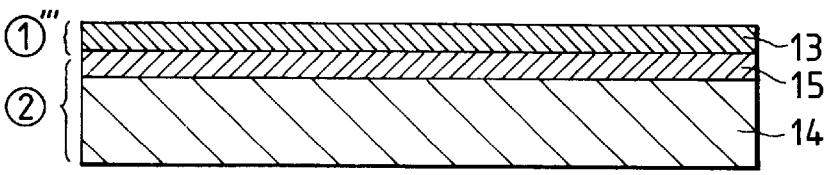

FIG. 1E illustrates a semiconductor substrate of the present invention. The monocrystalline Si layer 13 is formed flat and uniformly in a thin layer on the insulative substrate 15 and 14 over the entire large area of the wafer. The resulting semiconductor substrate is useful for production of insulation-isolated electronic elements.

The first monocrystalline Si substrate 11 may be repeatedly used for the same use after removal of the remaining Si and surface flattening treatment if the surface has become roughened unacceptably in the next production cycle.

The method of separation of the two substrates at the porous Si layer in the present invention includes crushing of the porous layer by compression on both faces of the bonded substrates; pulling of the respective substrates in opposite directions; insertion of a jig or the like into the porous layer; application of force in opposite directions parallel to the bonded face of the substrates; application of supersonic vibration to the porous layer; and so forth.

The porosity of the porous Si layer suitable for the separation ranges generally from 10 to 80%, preferably from 20 to 60%.

Embodiment 2

Figure 2A:
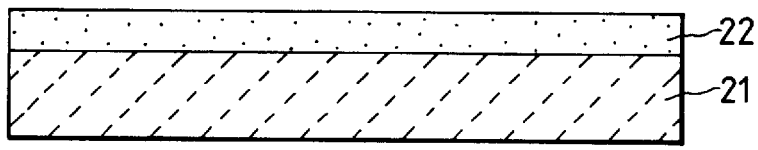
FIGS. 2A to 2E are schematic drawings for explaining another example of the process of the present invention.
Figure 2B:
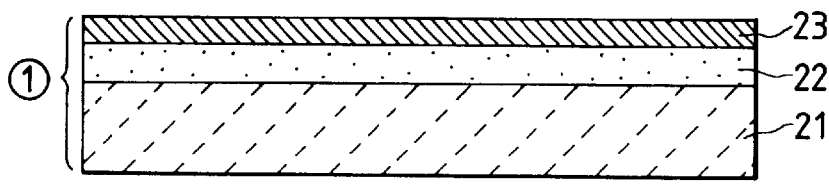

A first monocrystalline Si substrate 21 is made porous at the surface to form a porous layer 22 as shown in FIG. 2A. Then a nonporous monocrystalline Si layer 23 is formed on the porous Si layer 22 as shown in FIG. 2B.

Figure 2C:
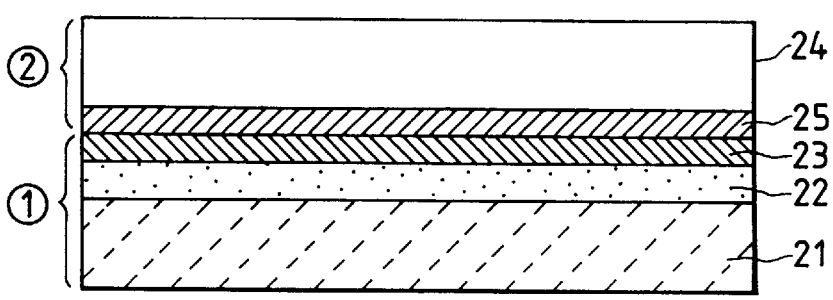

A light-transmissive supporting substrate 24 is brought into contact with the monocrystalline Si layer 23 with interposition of an insulative layer 25 at room temperature as shown in FIG. 2C, and then the contacted matter was subjected to anode coupling, compression, heat treatment, or combination of the treatment to bond tightly the light-transmissive supporting substrate 24 and the monocrystalline layer 23 with interposition of the insulative layer 25. The insulative layer 25 may be formed preliminarily on either one of the monocrystalline Si layer or the light-transmissive supporting substrate 24, or the three sheets may be bonded with interposition of an insulative thin film.

Figure 2D:
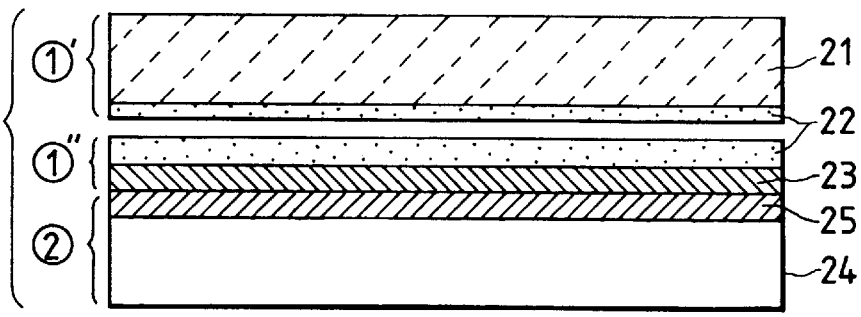

Subsequently, the substrates are separated at the porous Si layer 22 as shown in FIG. 2D. On the light-transmissive supporting substrate, the layers have the structure of porous Si 22/monocrystalline Si layer 23/insulative layer 25/light-transmissive supporting substrate 24.

The porous Si 22 is removed selectively by non-electrolytic wet chemical etching by use of at least one of a usual Si etching solution, hydrofluoric acid or a mixture of hydrofluoric acid with alcohol and/or hydrogen peroxide as the porous Si-selective etching solution, and buffered hydrofluoric acid or a mixture of hydrofluoric acid with alcohol and/or hydrogen peroxide to leave a thin-layered monocrystalline Si layer 23 on the insulative substrate 25 and 24. As described above in detail, the porous Si can be etched selectively by a usual Si etching solution because of the extremely large surface area of the porous surface area.

Otherwise, the porous Si 23 is selectively removed by grinding by utilizing the monocrystalline Si layer 22 as the grinding stopper.

Figure 2E:
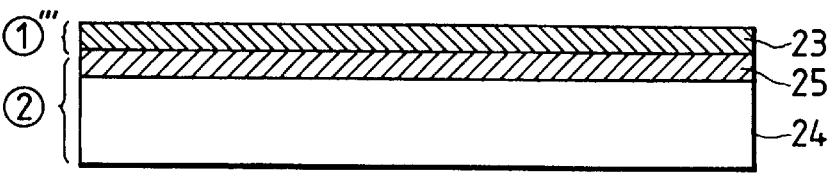

FIG. 2E illustrates a semiconductor substrate of the present invention. The monocrystalline Si layer 23 is formed flat and uniformly in a thin layer on the insulative substrate 25 and 24 over the entire large area of the wafer. The obtained semiconductor substrate is useful for production of insulation-isolated electronic elements.

The presence of the interposed insulative layer 25 is not essential.

The first monocrystalline Si substrate 21 may be repeatedly used for the same use after removal of the remaining Si and surface flattening treatment if the surface has become roughened unacceptably in the next production cycle.

Embodiment 3

Figure 3A:
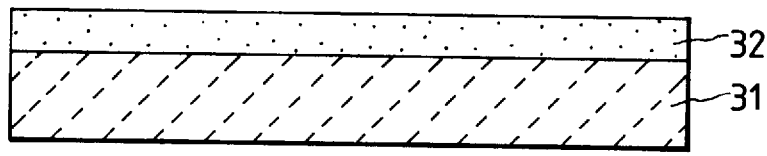
FIGS. 3A to 3E are schematic drawings for explaining a still another example of the process of the present invention.
Figure 3B:
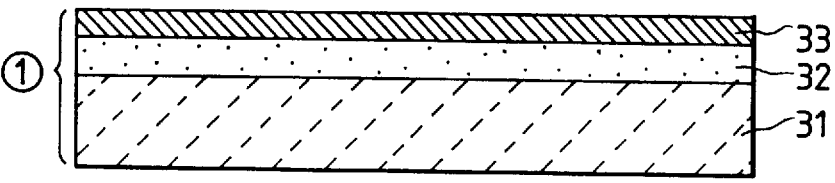

A first monocrystalline Si substrate 31 is made porous at the surface to form a porous layer 32 as shown in FIG. 3A. Then a nonporous monocrystalline compound semiconductor layer 33 is formed on the porous Si layer 32 as shown in FIG. 3B.

Figure 3C:
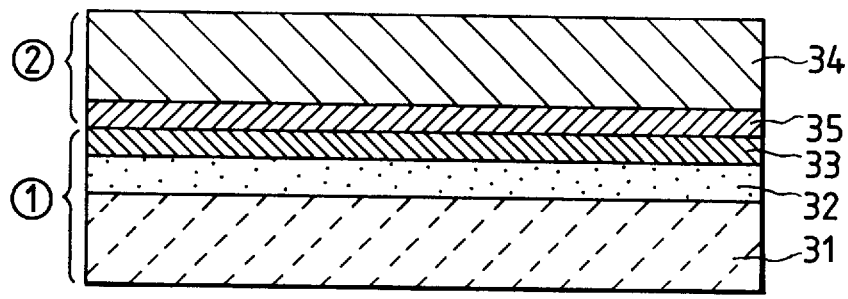

Another Si supporting substrate 34 is brought into close contact with the monocrystalline compound semiconductor layer 33 with interposition of an insulative layer 35 at room temperature as shown in FIG. 3C, and then the contacted matter was subjected to anode coupling, compression, or heat treatment, or combination of the treatments to bond tightly the Si supporting substrate 34 and the monocrystalline layer 33 with interposition of the insulative layer 35. The insulative layer 35 may be formed preliminarily on either one of the monocrystalline compound semiconductor layer or the Si supporting substrate 34, or the three sheets may be bonded with interposition of an insulative thin film.

Figure 3D:
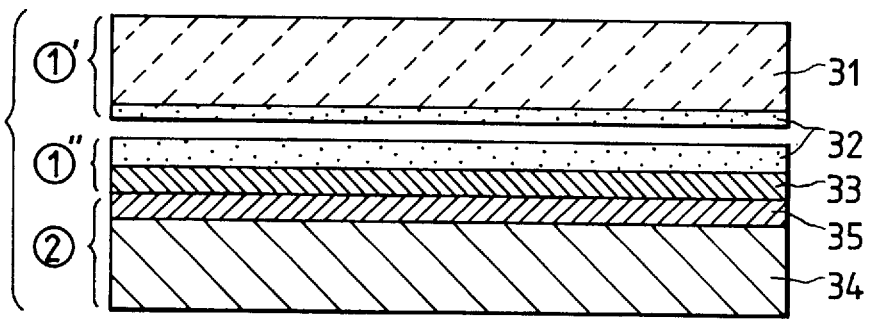

Subsequently, the substrates are separated at the porous Si layer 32 as shown in FIG. 3D. On the Si supporting substrate, the layers have the structure of porous Si 32/monocrystalline compound semiconductor layer 33/insulative layer 35/Si supporting substrate 34.

The porous Si 32 is removed selectively by chemical etching by use of an etching solution which is capable of etching Si at a higher etching rate than the compound semiconductor to leave the thin-layered monocrystalline compound semiconductor layer 33 on the insulative substrate 35 and 34.

Otherwise, the porous Si 32 is selectively removed by grinding by utilizing the monocrystalline compound semiconductor layer 33 as the grinding stopper.

Figure 3E:
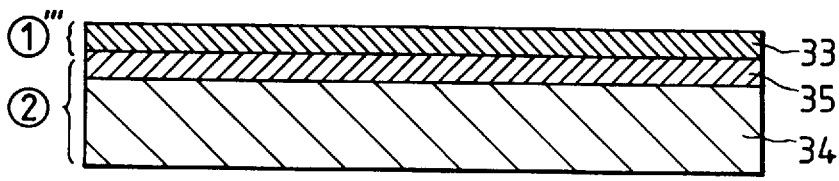

FIG. 3E illustrates a semiconductor substrate of the present invention. The monocrystalline compound semiconductor layer 33 is formed flat and uniformly in a thin layer on the insulative substrate 35 and 34 over the entire large area of the wafer. The resulting semiconductor substrate is useful as a compound semiconductor substrate and for production of insulation-isolated electronic elements.

When the substrate is used as a compound semiconductor substrate, the insulative layer 35 is not essential.

The first monocrystalline Si substrate 31 may be repeatedly used for the same use after removal of the remaining Si and surface flattening treatment if the surface has become roughened unacceptably in the next production cycle.

Embodiment 4

Figure 4A:
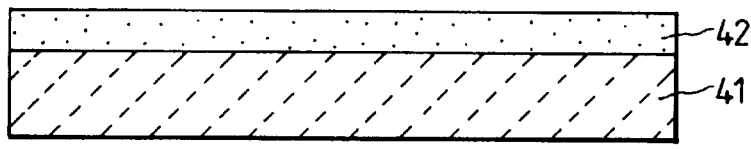
FIGS. 4A to 4E are schematic drawings for explaining a further example of the process of the present invention.
Figure 4B:
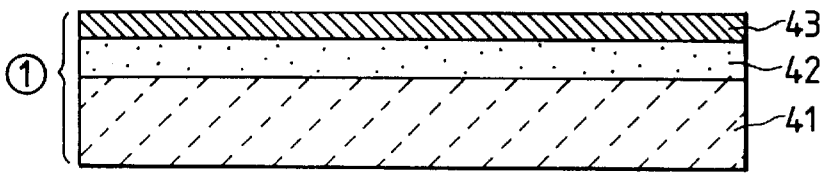

A first monocrystalline Si substrate 41 is made porous at the surface to form a porous layer 42 as shown in FIG. 4A. Then a nonporous monocrystalline compound semiconductor layer 43 is formed on the porous Si layer 42 as shown in FIG. 4B.

Figure 4C:
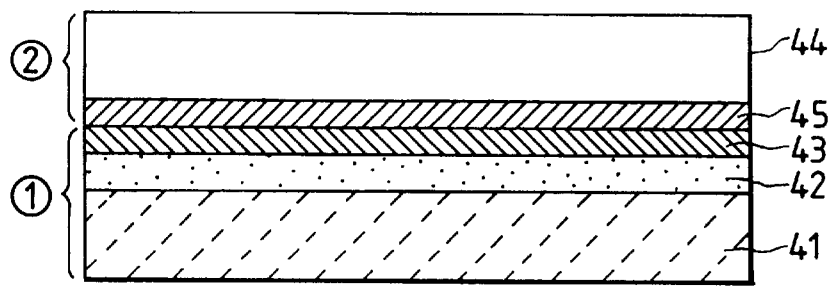

A light-transmissive supporting substrate 44 is brought into close contact with the monocrystalline compound semiconductor layer 43 with interposition of an insulative layer 45 at room temperature as shown in FIG. 4C, and then the contacted matter was subjected to anode coupling, compression, heat treatment, or combination of the treatments to bond tightly the light-transmissive supporting substrate 44 with the monocrystalline layer 43 with interposition of the insulative layer 45. The insulative layer 45 may be formed preliminarily on either one of the monocrystalline compound semiconductor layer or the light-transmissive supporting substrate 44, or the three sheets may be bonded with interposition of an insulative thin film.

Figure 4D:
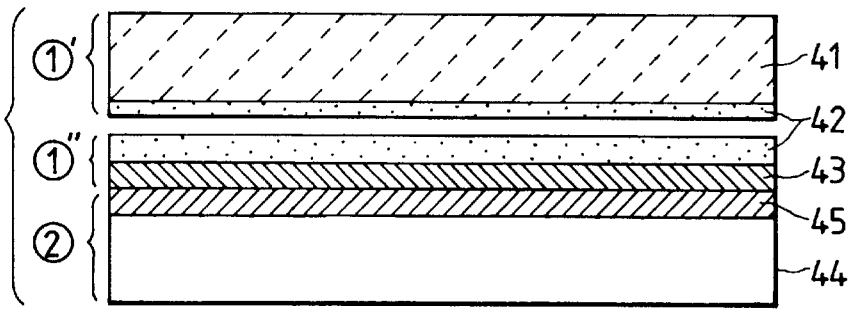

Subsequently, the substrates are separated at the porous Si layer 42 as shown in FIG. 4D. On the light-transmissive supporting substrate, the layers have the structure of porous Si 42/monocrystalline compound semiconductor layer 43/insulative layer 45/light-transmissive supporting substrate 44.

The porous Si 42 is removed selectively by chemical etching by use of an etching solution which is capable of etching Si at a higher etching rate than the compound semiconductor to leave a thin-layered monocrystalline compound semiconductor layer 43 on the insulative substrate 45 and 44.

Otherwise, the porous Si 42 is selectively removed by grinding by utilizing the monocrystalline compound semiconductor layer 43 as the grinding stopper.

Figure 4E:
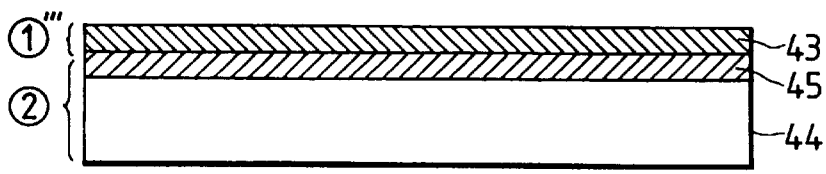

FIG. 4E illustrates a semiconductor substrate of the present invention. The monocrystalline compound semiconductor layer 43 is formed flat and uniformly in a thin layer on the insulative substrate 45 and 44 over the entire large area of the wafer. The resulting semiconductor substrate is useful for production of insulation-isolated electronic elements.

The insulative layer 45 is not essential in this embodiment.

The first monocrystalline Si substrate 41 may be repeatedly used for the same use after removal of the remaining Si and surface flattening treatment if the surface has become roughened unacceptably in the next production cycle.

Embodiment 5

Figure 5A:
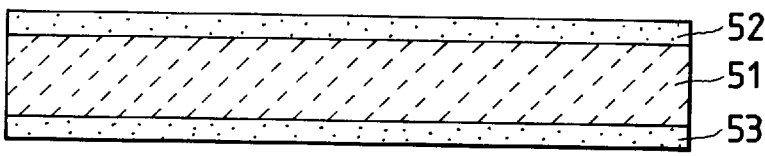
FIGS. 5A to 5E are schematic drawings for explaining a still further example of the process of the present invention.
Figure 5B:
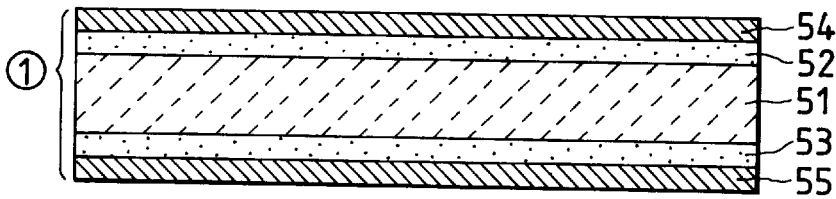

A first monocrystalline Si substrate 51 is made porous at the both faces to form porous layers 52, 53 as shown in FIG. 5A. Then, nonporous monocrystalline compound semiconductor layers 54, 55 are formed on the porous Si layers 52, 53 as shown in FIG. 5B.

Figure 5C:
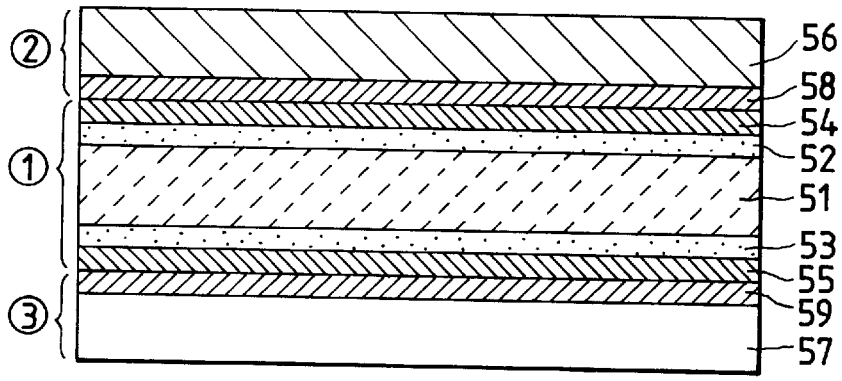

Two supporting substrates 56, 57 are brought into close contact with the monocrystalline semiconductor layers 54, 55 with interposition of insulative layers 58, 59 respectively at room temperature as shown in FIG. 5C, and then the contacted matter is subjected to anode coupling, compression, heat treatment, or combination of the treatments to bond tightly the supporting substrates 56, 57 and the monocrystalline layers 54, 55 with interposition of the insulative layers 58, 59. In the bonding, the respective insulative layers 58, 59 may be formed preliminarily on either one of the monocrystalline semiconductor layer 54, 55 or the supporting substrate 56, or the five sheets may be bonded with interposition of insulative thin films.

Figure 5D:
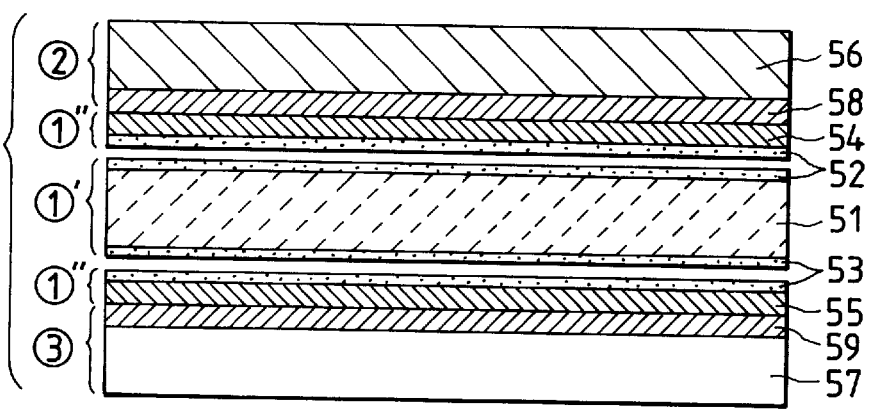

Subsequently, the substrates are separated into three at the both porous Si layers 52, 53 as shown in FIG. 5D. The two supporting substrates come to have a structure of porous Si/monocrystalline semiconductor layer/insulative layer/supporting substrate (52/54/58/56, and 53/55/59/57).

The porous Si layers 52, 53 are removed selectively by chemical etching to leave thin-layered monocrystalline semiconductor layers 54, 55 on the supporting substrates 58/56 and 59/57.

Otherwise, the porous Si 52, 53 is selectively removed by grinding by utilizing the monocrystalline semiconductor layers 54, 55 as the grinding stopper.

Figure 5E:
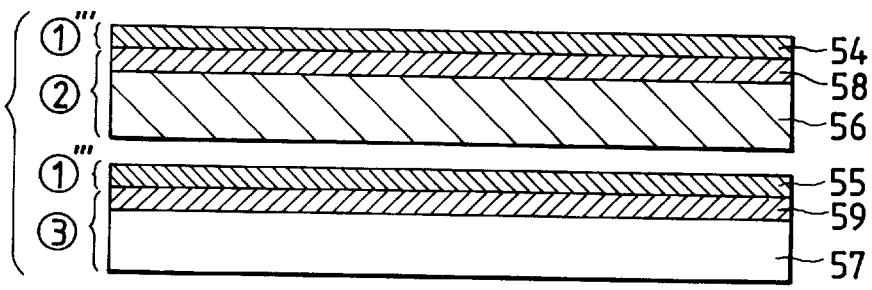

FIG. 5E illustrates semiconductor substrates prepared according to the present invention. The monocrystalline compound semiconductor layers are formed flat and uniformly in a thin layer on the supporting substrates over the entire large area of the two wafers at a time with a large area. The resulting semiconductor substrate is useful for production of insulation-isolated electronic elements.

The insulative intervening layers 58, 59 are not essential.

The supporting substrates 56, 57 need not be the same.

The first monocrystalline Si substrate 51 may be repeatedly used for the same use after removal of the remaining Si and surface flattening treatment if the surface has become roughened unacceptably in the next production cycle.

EXAMPLE 1

A first monocrystalline (100) Si substrate of P-type having a diameter of 6 inches, a thickness of 625 $\mu$m, and a specific resistance of 0.01 $\Omega \cdot$cm was anodized in an HF solution under the anodization conditions as below:

| | |
|---|---|
| Current density: | 5 mA·cm$^{-2}$ |
| Anodization solution: | HF:H$_2$O:C$_2$H$_5$OH = 1:1:1 |
| Time: | 12 minutes |
| Thickness of porous Si: | 10 $\mu$m |
| Porosity: | 15% |

This substrate was oxidized at 400° C. in an oxygen atmosphere for one hour. Thereby the inner wall of the pores of the porous Si was covered with a thermal oxidation film. On the porous Si, monocrystalline Si was allowed to grow epitaxially in a thickness of 1 $\mu$m by CVD (chemical vapor deposition) under the growth conditions below:

| | |
|---|---|
| Source gas: | SiH$_2$Cl$_2$/H$_2$ |
| Gas flow rate: | 0.5/180 l/min |
| Gas pressure: | 80 Torr |
| Temperature: | 950° C. |
| Growth rate: | 0.3 $\mu$m/min |

The face of the epitaxially grown Si layer was thermally oxidized to form an SiO$_2$ layer of 100 nm thick.

On the face of this Si substrate, a separately prepared second Si substrate having an SiO$_2$ layer of 500 nm thick was superposed with the SiO$_2$ layer inside, and the superposed matter was heat-treated at 900° C. for 2 hours to bond the substrates tightly.

A pulling force was applied to the resulting bonded wafer in the direction perpendicular to the wafer face in such a manner that a plate was bonded respectively to each of the both faces of the wafer with an adhesive and the plates were pulled to opposite directions with a jig. Consequently, the porous Si layer was broken to cause separation of the wafer into two sheets with the porous Si layers exposed.

The porous Si layer on the second substrate was etched selectively in a mixture of 49% hydrofluoric acid and 30% hydrogen peroxide (1:5) with agitation. The porous Si was etched and removed completely with the monocrystalline Si remaining unetched as an etching stopper. The etching rate of the nonporous monocrystalline Si was extremely low, the selection ratio of the etching rate of the porous Si being 105 or higher. Therefore, the decrease in thickness of the nonporous layer by etching was practicably negligible (several tens of Å).

Consequently, a monocrystalline Si layer was formed in a thickness of 1 μm on an Si oxide film. The monocrystalline Si layer did not change at all by the selective etching of the porous Si layer.

The cross-section of the Si layer was observed by transmission electron microscopy, and it was confirmed that no additional crystal defect was formed in the Si layer and the excellent crystallinity was retained.

Thus an SOI substrate was obtained which has a semiconductor layer of high quality.

The other Si substrate having been separated at the porous Si layer portion was etched in the same manner as above to remove the remaining porous layer, and its surface was polished. The obtained Si substrate was used repeatedly for the same use in the next production cycle. Thereby a plurality of SOI substrates having a semiconductor layer of high quality were obtained.

EXAMPLE 2

A first monocrystalline (100) Si substrate of P-type having a diameter of 4 inches, a thickness of 525 μm, and a specific resistance of 0.01 Ω·cm was anodized in an HF solution under the anodization conditions as below:

| Current density: | 7 mA·cm$^{-2}$ |
|---|---|
| Anodization solution: | HF:H$_2$O:C$_2$H$_5$OH = 1:1:1 |
| Time: | 12 minutes |
| Thickness of porous Si: | 10 μm |
| Porosity: | 15% |

This substrate was oxidized at 400° C. in an oxygen atmosphere for 2 hours. Thereby the inner wall of the pores of the porous Si was covered with a thermal oxidation film. On the porous Si, monocrystalline Si was allowed to grow epitaxially in a thickness of 0.5 μm by MBE (molecular beam epitaxy) under the growth conditions below:

| Temperature: | 700° C. |
|---|---|
| Pressure: | 1 × 10$^{-9}$ Torr |
| Growth rate: | 0.1 μm/sec |
| Temperature: | 950° C. |
| Growth rate: | 0.3 μm/min |

The face of the epitaxially grown Si layer was thermally oxidized to form an SiO$_2$ layer of 100 nm thick.

On the face of the SiO$_2$ layer, was superposed a separately prepared fused quartz substrate, and the superposed matter was heat-treated at 400° C. for 2 hours to bond the substrates.

A sufficient compression force was applied uniformly to the resulting bonded wafer in the direction perpendicular to the wafer face such that plates were bonded to each of the both faces of the wafer with an adhesive and the compression force was applied with the same jig as in Example 1.

Consequently, the porous Si layer was broken to cause separation of the wafer into two sheets with the porous Si layers exposed.

The porous Si layers were etched selectively in a mixture of buffered hydrofluoric acid and 30% hydrogen peroxide (1:5) with agitation. Thereby the porous Si was etched and removed completely with the monocrystalline Si remaining unetched as an etch-stop material. The etching rate of the nonporous monocrystalline Si was extremely low, the selection ratio of the etching rate of the porous Si being, 105 or higher. Therefore, the decrease in thickness of the nonporous layer by etching was practicably negligible (several tens of Å).

Consequently, a monocrystalline Si layer was formed in a thickness of 0.5 μm on a fused quartz substrate. The monocrystalline Si layer did not change at all by the selective etching of the porous Si layer.

The cross-section of the Si layer was observed by transmission electron microscopy, and it was confirmed that no additional crystal defect was formed in the Si layer and the excellent crystallinity was retained.

A plurality of SOI substrates having a semiconductor layer of high quality were prepared by repeating the above process in the same manner as in Example 1.

EXAMPLE 3

A first monocrystalline (100) Si substrate of P-type or N-type having a diameter of 6 inches, a thickness of 625 μm, and a specific resistance of 0.01 Q·cm was anodized in an HF solution under the anodization conditions as below:

| Current density: | 7 mA·cm$^{-2}$ |
|---|---|
| Anodization solution: | HF:H$_2$O:C$_2$H$_5$OH = 1:1:1 |
| Time: | 12 minutes |
| Thickness of porous Si: | 10 μm |
| Porosity: | 15% |

This substrate was oxidized at 400° C. in an oxygen atmosphere for one hour. Thereby the inner wall of the pores of the porous Si was covered with a thermal oxidation film. On the porous Si, monocrystalline GaAs was allowed to grow epitaxially in a thickness of 1 μm by MOCVD (metal organic chemical vapor deposition) under the growth conditions below:

| Source gas: | TMG/AsH$_3$/H$_2$ |
|---|---|
| Gas pressure: | 80 Torr |
| Temperature: | 700° C. |

On the face of the formed GaAs layer, was superposed a separately prepared second Si substrate, and the superposed matter was heat-treated at 900° C. for one hour to bond the substrates tightly.

A sufficient compression force was applied to the resulting bonded wafer in the same manner as in Example 2. Thereby, the porous Si layer was broken to allow the wafer to separate into two sheets with the porous Si layers exposed.

Then, the oxide film on the inner wall of the porous Si layer was removed by hydrofluoric acid, and the porous Si was etched with a mixture of ethylene diamine, pyrocathecol, and water (17 ml: 3 g: 8 ml) at 110° C.

Thereby the porous Si was etched selectively and removed completely with the monocrystalline GaAs remaining unetched as an etch-stopping material. The etching rate of the nonporous monocrystalline GaAs was extremely low and practicably negligible.

Consequently, a monocrystalline GaAs layer was formed in a thickness of 1 µm on a Si substrate. The monocrystalline GaAs layer did not change at all by the selective etching of the porous Si layer.

The cross-section of the GaAs layer was observed by transmission electron microscopy, and it was confirmed that no additional crystal defect was formed in the GaAs layer and the excellent crystallinity was retained.

A plurality of semiconductor substrates having a GaAs layer of high quality were prepared by repeating the above process in the same manner as in Example 2.

GaAs on an insulative film was also prepared by employing an Si substrate having an oxide film as the supporting substrate.

EXAMPLE 4

A first monocrystalline (100) Si substrate of P-type or N-type having a diameter of 5 inches, a thickness of 625µm, and a specific resistance of 0.01 n·cm was anodized in an HF solution under the anodization conditions as below:

| | |
|---|---|
| Current density: | 10 mA·cm$_{-2}$ |
| Anodization solution: | HF:H$_2$O:C$_2$H$_5$OH = 1:1:1 |
| Time: | 24 minutes |
| Thickness of porous Si: | 20 µm |
| Porosity: | 17% |

This substrate was oxidized at 400° C. in an oxygen atmosphere for 2 hours. Thereby the inner wall of the pores of the porous Si was covered with a thermal oxidation film. On the porous Si, monocrystalline AlGaAs was allowed to grow epitaxially in a thickness of 0.5 µm by MBE (molecular beam epitaxy).

On the face of the formed AlGaAs layer, was superposed a face of a separately prepared low-melting glass substrate. The superposed matter was heat-treated at 500° C. for 2 hours to bond the substrates tightly.

A sufficient compression force was applied to the resulting bonded wafer in the same manner as in Example 2. Thereby, the porous Si layer was broken to allow the wafer to separate into two sheets with the porous Si layers exposed.

The porous Si was etched with hydrofluoric acid solution. Thereby the porous Si was etched selectively and removed off completely with the monocrystalline AlGaAs remaining unetched as an etch-stopping material. The etching rate of the nonporous monocrystalline AlGaAs was extremely low and practicably negligible.

Consequently, a monocrystalline AlGaAs layer was formed in a thickness of 0.5 ~m on a glass substrate. The monocrystalline AlGaAs layer did not change at all by the selective etching of the porous Si layer.

The cross-section of the AlGaAs layer was observed by transmission electron microscopy, and it was confirmed that no additional crystal defect was formed in the AlGaAs layer and the excellent crystallinity was retained.

A plurality of semiconductor substrates having a GaAs layer of high quality were prepared by repeating the above process in the same manner as in Example 2.

EXAMPLE 5

A first monocrystalline (100) Si substrate of P-type or N-type having been polished on the both faces and having a diameter of 6 inches, a thickness of 625 µm, and a specific resistance of 0.01 Ω·cm was anodized on the both faces in an HF solution under the anodization conditions below:

| | |
|---|---|
| Current density: | 5 mA·cm$^{-2}$ |
| Anodization solution: | HF:H$_2$O:C$_2$H$_5$OH = 1:1:1 |
| Time: | 12 × 2 minutes |
| Thickness of porous Si: | 10 µm each |
| Porosity: | 15% |

This substrate was oxidized at 400° C. in an oxygen atmosphere for one hour. Thereby the inner wall of the pores of the porous Si was covered with a thermal oxidation film. On the porous Si formed on the both faces of the substrate, monocrystalline Si was allowed to grow epitaxially in a thickness of 1 µm respectively by CVD (chemical vapor deposition) under the growth conditions below:

| | |
|---|---|
| Source gas: | SiH$_2$Cl$_2$/H$_2$ |
| Gas flow rate: | 0.5/180 l/min |
| Gas pressure: | 80 Torr |
| Temperature: | 950° C. |
| Growth rate: | 0.3 µm/min |

The faces of the formed epitaxial Si layers were thermally oxidized to form SiO$_2$ layers in a thickness of 100 nm.

On each of the faces of the SiO$_2$ layers, a separately prepared Si substrate having a 500-nm thick SiO$_2$ layer was superposed respectively with the SiO$_2$ layers inside, and the superposed matter was heat-treated at 600° C. for 2 hours to bond the substrates tightly.

A sufficient pulling force was applied to the resulting bonded wafer in the direction perpendicular to the bonded wafer face in the same manner as in Example 1. Thereby, the two porous Si layers were broken to allow the wafer to separate into three sheets with the porous Si layers exposed.

The porous Si layers were etched selectively with a mixture of 49% hydrofluoric acid with 30% hydrogen peroxide (1:5) with agitation. Thereby the porous Si was etched selectively and removed completely with the monocrystalline Si remaining unetched as an etch-stopping material. The etching rate of the nonporous monocrystalline Si was extremely low, the selection ratio of the etching rate of the porous Si being 105 or higher. Therefore, the decrease in thickness of the nonporous layer by etching was practicably negligible (several tens of Å).

Consequently, a monocrystalline Si layer was formed in a thickness of 1 µm respectively on the two Si oxide films simultaneously. The monocrystalline Si layers did not change at all by the selective etching of the porous Si layer.

The cross-section of the Si layer was observed by transmission electron microscopy, and it was confirmed that no additional crystal defect was formed in the Si layer and the excellent crystallinity was retained.

A plurality of semiconductor substrates having a semiconductor layer of high quality were prepared by repeating the above process in the same manner as in Example 1.

EXAMPLE 6

A first monocrystalline (100) Si substrate of P-type or N-type having a diameter of 5 inches, a thickness of 625 ~m, and a specific resistance of 0.01 Ω·cm was anodized in an HF solution under the anodization conditions below:

| Current density: | 7 mA·cm$^{-2}$ |
|---|---|
| Anodization solution: | HF:H$_2$O:C$_2$H$_5$OH = 1:1:1 |
| Time: | 4 minutes |
| Thickness of porous Si: | 3 μm |
| Porosity: | 15% |

The anodization was conducted further under the conditions below:

| Current density: | 30 mA·cm$^{-2}$ |
|---|---|
| Anodization solution: | HF:H$_2$O:C$_2$H$_5$OH = 1:3:2 |
| Time: | 3 minutes |
| Thickness of porous Si: | 10 μm |
| Porosity: | 45% |

This substrate was oxidized at 400° C. in an oxygen atmosphere for one hour. Thereby the inner wall of the pores of the porous Si was covered with a thermal oxidation film. On the porous Si formed on the substrate, monocrystalline Si was allowed to grow epitaxially in a thickness of 0.3 μm by CVD under the conditions below:

| Source gas: | SiH$_4$ |
|---|---|
| Carrier gas: | H$_2$ |
| Temperature: | 850° C. |
| Pressure: | 1 × 10$^{-2}$ Torr |
| Growth rate: | 3.3 nm/sec |

The surface of the formed epitaxial Si layer was thermally oxidized to form SiO$_2$ layer in a thickness of 100 nm. On the face of the SiO$_2$ layer, a separately prepared second Si substrate having a 500-nm thick SiO$_2$ layer was superposed with the SiO$_2$ layer inside, and the superposed matter was heat-treated at 700° C. for 2 hours to bond the substrates tightly.

A sufficient pulling force was applied to the resulting bonded wafer in the direction perpendicular to the bonded wafer face in the same manner as in Example 1. Thereby, the porous Si layer was broken to allow the wafer to separate into two sheets with the porous Si layers exposed.

The porous Si on the second Si substrate was etched selectively with an etching solution of HF/HNO$_2$/CH$_3$COOH type. Thereby the porous Si was etched selectively and removed completely. The etching rate of the nonporous monocrystalline Si was extremely low, so that the thickness decrease of the nonporous layer by etching was practicably negligible.

Consequently, a monocrystalline Si layer was formed in a thickness of 1 μm on the Si oxide film. The monocrystalline Si layers did not change at all by the selective etching of the porous Si layer.

The cross-section of the Si layer was observed by transmission electron microscopy, and it was confirmed that no additional crystal defect was formed in the Si layer and the excellent crystallinity was retained. A plurality of semiconductor substrates having a semiconductor layer of high quality were prepared by repeating the above process in the same manner as in Example 1.

EXAMPLE 7

A first monocrystalline (100) Si substrate of P-type or N-type having a diameter of 6 inches, a thickness of 625 μ, and a specific resistance of 0.01 Ω·cm was anodized in an HF solution under the anodization conditions below:

| Current density: | 5 mA·cm$^{-2}$ |
|---|---|
| Anodization solution: | HF:H$_2$O:C$_5$H$_5$OH = 1:1:1 |
| Time: | 12 minutes |
| Thickness of porous Si: | 10 μm |
| Porosity: | 15% |

This substrate was oxidized at 400° C. in an oxygen atmosphere for one hour. Thereby the inner wall of the pores of the porous Si was covered with a thermal oxidation film. On the porous Si formed on the substrate, monocrystalline Si was allowed to grow epitaxially in a thickness of 1 gm by CVD under the growth conditions below:

| Source gas: | SiH$_2$Cl$_2$/H$_2$ |
|---|---|
| Gas flow rate: | 0.5/180 l/min |
| Gas pressure: | 80 Torr |
| Temperature: | 950° C. |
| Growth rate: | 0.3 μm/min |

The surface of the formed epitaxial Si layer was thermally oxidized to form SiO$_2$ layer in a thickness of 100 nm.

On the face of the SiO$_2$ layer, a separately prepared second Si substrate having a 500-nm thick SiO$_2$ layer was superposed with the SiO$_2$ layer inside, and the superposed matter was heat-treated at 900° C. for 2 hours to bond the substrates tightly.

A sufficient pulling force was applied to the resulting bonded wafer in the direction perpendicular to the bonded wafer face in the same manner as in Example 1. Thereby, the porous Si layer was broken to allow the wafer to separate into two sheets with the porous Si layers exposed.

The porous Si layer on the second substrate was ground selectively by utilizing the monocrystalline layer as the stopper. Thereby the porous Si was removed selectively.

Consequently, a monocrystalline Si layer was formed in a thickness of 1 μm on the Si oxide film. The monocrystalline Si layers did not change at all by the selective grinding of the porous Si layer.

The cross-section of the Si layer was observed by transmission electron microscopy, and it was confirmed that no additional crystal defect was formed in the Si layer and the excellent crystallinity was retained.

A plurality of semiconductor substrates having a semiconductor layer of high quality were prepared by repeating the above process in the same manner as in Example 1.

EXAMPLE 8

A first monocrystalline (100) Si substrate of P-type or N-type having a diameter of 6 inches, a thickness of 625 μm and a specific resistance of 0.01 Ω·cm was anodized in an HF solution under the anodization conditions below:

| Current density: | 5 mA·cm$^{-2}$ |
|---|---|
| Anodization solution: | HF:H$_2$O:C$_2$H$_5$OH = 1:1:1 |
| Time: | 12 minutes |
| Thickness of porous Si: | 10 μm |
| Porosity: | 15% |

This substrate was oxidized at 400° C. in an oxygen atmosphere for one hour. Thereby the inner wall of the pores of the porous Si was covered with a thermal oxidation film.

On the porous Si formed on the substrate, monocrystalline Si was allowed to grow epitaxially in a thickness of 1 µm by CVD under the conditions below:

| | |
|---|---|
| Source gas: | SiH$_2$Cl$_2$/H$_2$ |
| Gas flow rate: | 0.5/180 l/min |
| Gas pressure: | 80 Torr |
| Temperature: | 950° C. |
| Growth rate: | 0.3 µm/min |

The surface of the formed epitaxial Si layer was thermally oxidized to form SiO$_2$ layer in a thickness of 100 nm.

On the face of the SiO$_2$ layer, a separately prepared second Si substrate having a 500-nm thick SiO$_2$ layer was superposed with the SiO$_2$ layer inside, and the superposed matter was heat-treated at 900° C. for 2 hours to bond the substrates tightly.

A supersonic energy was applied to the resulting bonded wafer in a vessel provided with a supersonic oscillator. Thereby, the porous Si layer was broken to allow the wafer to separate into two sheets with the porous Si layers exposed.

The porous Si layer on the second Si substrate was etched selectively with a mixture of 49% hydrofluoric acid with 30% hydrogen peroxide (1:5) with agitation. Thereby the porous Si was etched selectively and removed completely with the monocrystalline Si remaining unetched as an etch-stopping material. The etching rate of the nonporous monocrystalline Si was extremely low, the selection ratio of the etching rate of the porous Si being 105 or higher. Therefore, the decrease in thickness of the nonporous layer by etching was practicably negligible (several tens of Å).

Consequently, a monocrystalline Si layer was formed in a thickness of 1 µm on the Si oxide film. The monocrystalline Si layers did not change at all by the selective etching of the porous Si layer.

The cross-section of the Si layer was observed by transmission electron microscopy, and it was confirmed that no additional crystal defect was formed in the Si layer and the excellent crystallinity was retained.

The first monocrystalline Si substrate was used repeatedly for the same use after removal of the porous Si remaining thereon.

EXAMPLE 9

A first monocrystalline (100) Si substrate of P-type or N-type having a diameter of 4 inches, a thickness of 525 µm, and a specific resistance of 0.01 Ω·cm was anodized in an HF solution under the anodization conditions as below:

| | |
|---|---|
| Current density: | 7 mA·cm$^{-2}$ |
| Anodization solution: | HF:H$_2$O:C$_2$H$_5$OH = 1:1:1 |
| Time: | 12 minutes |
| Thickness of porous Si: | 10 µm |
| Porosity: | 15% |

This substrate was oxidized at 400° C. in an oxygen atmosphere for 2 hours. Thereby the inner wall of the pores of the porous Si was covered with a thermal oxidation film. On the porous Si, monocrystalline Si was allowed to grow epitaxially in a thickness of 0.5 µm by MBE (molecular beam epitaxy) under the growth conditions below:

| | |
|---|---|
| Temperature: | 700° C. |
| Pressure: | 1 × 10$^{-9}$ Torr |
| Growth rate: | O.1 nm/sec |
| Temperature: | 950° C. |
| Growth rate: | 0.3 µm/min |

The surface of the epitaxially grown Si layer was thermally oxidized to form an SiO$_2$ layer of 100 nm thick.

On the face of the SiO$_2$ layer, was superposed a separately prepared fused quartz substrate, and the superposed matter was heat-treated at 400° C. for 2 hours to bond the substrates.

The end of the porous layer was bared to the edge face of the wafer, and the porous Si is slightly etched. Thereto, a sharp blade like a shaver blade was inserted. Thereby, the porous layer was broken, and the wafer was separated into two sheets with the porous Si layers exposed.

The porous Si layer on the fused quartz substrate was etched selectively in a mixture of buffered hydrofluoric acid and 30% hydrogen peroxide (1:5) with agitation. Thereby the porous Si was etched and removed completely with the monocrystalline Si remaining unetched as an etch-stopping material. The etching rate of the nonporous monocrystalline Si was extremely low, the selection ratio of the etching rate of the porous Si being, 105 or higher. Therefore, the decrease in thickness of the nonporous layer by etching was practicably negligible (several tens of Å).

Consequently, a monocrystalline Si layer was formed in a thickness of 0.5 µm on a fused quartz substrate. The monocrystalline Si layer did not change at all by the selective etching of the porous Si layer.

The cross-section of the Si layer was observed by transmission electron microscopy, and it was confirmed that no additional crystal defect was formed in the Si layer and the excellent crystallinity was retained.

The same results were obtained without forming the oxide film of the surface of the epitaxial Si surface. The first monocrystalline Si substrate was used repeatedly for the same use after removal of the remaining porous Si and mirror-polishing of the surface.

EXAMPLE 10

A first monocrystalline (100) Si substrate of P-type or N-type having a polished face on each side and having a diameter of 6 inches, a thickness of 625 µm, and a specific resistance of 0.01 Ω·cm was anodized on both sides in an HF solution under the anodization conditions below:

| | |
|---|---|
| Current density: | 5 mA·cm$^{-2}$ |
| Anodization solution: | HF:H$_2$O:C$_2$H$_5$OH = 1:1:1 |
| Time: | 12 × 2 minutes |
| Thickness of porous Si: | 10 µm each |
| Porosity: | 15% |

This substrate was oxidized at 400° C. in an oxygen atmosphere for one hour. Thereby the inner wall of the pores of the porous Si was covered with a thermal oxidation film. On the porous Si formed on both faces of the substrate, monocrystalline Si was allowed to grow epitaxially in a thickness of 1 µm by CVD (chemical vapor deposition) under the conditions below:

| | |
|---|---|
| Source gas: | SiH$_2$Cl$_2$/H$_2$ |
| Gas flow rate: | 0.5/180 l/min |
| Gas pressure: | 80 Torr |
| Temperature: | 950° C. |
| Growth rate: | 0.3 μm/min |

The surfaces of the formed epitaxial Si layers were thermally oxidized to form SiO$_2$ layers in a thickness of 100 nm.

On each of the faces of the SiO$_2$ layers, a separately prepared second Si substrate having a 500-nm thick SiO$_2$ layer was superposed with the SiO$_2$ layer inside, and the superposed matter was heat-treated at 600° C. for 2 hours to bond the substrates tightly.

The porous layers were bared at the edge face of the wafer, and a liquid such as water was allowed to penetrate into the porous Si. The entire bonded wafer was heated or cooled, whereby the porous Si layers were broken owing to expansion or other causes to allow the wafer to separate into three sheets with the porous Si layers exposed.

The porous Si layers were etched selectively with a mixture of 49% hydrofluoric acid with 30% hydrogen peroxide (1:5) with agitation. Thereby the porous Si was etched selectively and removed completely with the monocrystalline Si remaining unetched as an etch-stopping material. The etching rate of the nonporous monocrystalline Si was extremely low, the selection ratio of the etching rate of the porous Si being 105 or higher. Therefore, the decrease in thickness of the nonporous layer by etching was practicably negligible (several tens of Å).

Consequently, a monocrystalline Si layer was formed in a thickness of 1 μm respectively on the two Si oxide films simultaneously. The monocrystalline Si layers did not change at all by the selective etching of the porous Si layer.

The cross-section of the Si layer was observed by transmission electron microscopy, and it was confirmed that no additional crystal defect was formed in the Si layer and the excellent crystallinity was retained.

The same results were obtained without formation of the oxide film on the surface of the epitaxial Si layer.

The first monocrystalline Si substrate was used repeatedly for the same use after removal of the remaining porous Si and flattening of the surface by hydrogen treatment.

EXAMPLE 11

A first monocrystalline (100) Si substrate of P-type or N-type having a diameter of 5 inches, a thickness of 625 μm, and a specific resistance of 0.01 Q·cm was anodized in an HF solution under the anodization conditions below:

| | |
|---|---|
| Current density: | 7 mA·cm$^{-2}$ |
| Anodization solution: | HF:H$_2$O:C$_2$H$_5$OH = 1:1:1 |
| Time: | 4 minutes |
| Thickness of porous Si: | 3 μm |
| Porosity: | 15% |

The anodization was conducted further under the conditions below:

| | |
|---|---|
| Current density: | 30 mA·cm$^{-2}$ |
| Anodization solution: | HF:H$_2$O:C$_2$H$_5$OH = 1:3:2 |
| Time: | 3 minutes |
| Thickness of porous Si: | 10 μm |
| Porosity: | 45% |

This substrate was oxidized at 400° C. in an oxygen atmosphere for one hour. Thereby the inner wall of the pores of the porous Si was covered with a thermal oxidation film. On the porous Si formed on the substrate, monocrystalline Si was allowed to grow epitaxially in a thickness of 0.3 μm by CVD under the conditions below:

| | |
|---|---|
| Source gas: | SiH$_4$ |
| Carrier gas: | H$_2$ |
| Temperature: | 850° C. |
| Pressure: | 1 × 10$^{-2}$ Torr |
| Growth rate: | 3.3 nm/sec |

The surface of the formed epitaxial Si layer was thermally oxidized to form a SiO$_2$ layer in a thickness of 100 nm.

On the face of the SiO$_2$ layer, a separately prepared second Si substrate having a 500-nm thick SiO$_2$ layer was superposed with the SiO$_2$ layer inside, and the superposed matter was heat-treated at 700° C. for 2 hours to bond the substrates tightly.

A force was applied to the first (or second) substrate in a direction parallel to the second (or first) substrate, whereby the porous Si layer was broken by the shear stress to allow the wafer to separate into two sheets with the porous Si layers exposed.

The porous Si layer was etched selectively with an HF/HNO$_3$/CH$_3$COOH type etching solution. Thereby the porous Si was etched selectively and removed completely. The etching rate of the nonporous monocrystalline Si was extremely low, so that the decrease in thickness of the nonporous layer by etching was practicably negligible.

Consequently, a monocrystalline Si layer was formed in a thickness of 1 μm on the Si oxide layer. The monocrystalline Si layer did not change at all by the selective etching of the porous Si layer.

The cross-section of the Si layer was observed by transmission electron microscopy, and it was confirmed that no additional crystal defect was formed in the Si layer and the excellent crystallinity was retained.

The same results were obtained without forming the oxide film on the surface of the epitaxial Si layer surface.

The first monocrystalline Si substrate was used repeatedly for the same use after removal of the remaining porous Si.

EXAMPLE 12

A first monocrystalline (100) Si substrate of P-type or N-type having a diameter of 5 inches, a thickness of 625 μm, and a specific resistance of 0.01 Q·cm was anodized in an HF solution under the anodization conditions below:

| | |
|---|---|
| Current density: | 7 mA·cm$^{-2}$ |
| Anodization solution: | HF:H$_2$O:C$_2$H$_5$OH = 1:1:1 |
| Time: | 4 minutes |
| Thickness of porous Si: | 3 μm |
| Porosity: | 15% |

The anodization was conducted further under the conditions below:

| | |
|---|---|
| Current density: | 30 mA·cm$^{-2}$ |
| Anodization solution: | HF:H$_2$O:C$_2$H$_5$OH = 1:3:2 |
| Time: | 3 minutes |
| Thickness of porous Si: | 10 μm |
| Porosity: | 45% |

This substrate was oxidized at 400° C. in an oxygen atmosphere for one hour. Thereby the inner wall of the pores of the porous Si was covered with a thermal oxidation film. On the porous Si formed on the substrate, monocrystalline Si was allowed to grow epitaxially in a thickness of 0.3 μm by CVD under the conditions below:

| | |
|---|---|
| Source gas: | SiH$_4$ |
| Carrier gas: | H$_2$ |
| Temperature: | 850° C. |
| Pressure: | 1 × 10$^{-2}$ Torr |
| Growth rate: | 3.3 nm/sec |

The surface of the formed epitaxial Si layer was thermally oxidized to form a SiO$_2$ layer in a thickness of 100 nm.

On the face of the SiO$_2$ layer, a separately prepared second Si substrate having a 500-nm thick SiO$_2$ layer was superposed with the SiO$_2$ layer inside, and the superposed matter was heat-treated at 700° C. for 2 hours to bond the substrates tightly.

The porous layers were bared at the edge face of the wafer, and the porous Si was etched from the edge face with a selective etching solution, whereby the wafer came to be separated into two sheets.

Further, the porous Si layer on the second Si substrate was etched selectively with an HF/HNO$_3$/CH$_3$COOH type etching solution. Thereby the porous Si was etched selectively and removed completely. The etching rate of the nonporous monocrystalline Si was extremely low, so that the thickness decrease of the nonporous layer by etching was practicably negligible.

Consequently, a monocrystalline Si layer was formed in a thickness of 1 μm on the Si oxide film. The monocrystalline Si layers did not change at all by the selective etching of the porous Si layer.

The cross-section of the Si layer was observed by transmission electron microscopy, and it was confirmed that no additional crystal defect was formed in the Si layer and the excellent crystallinity was retained.

The same results were obtained without forming the oxide film on the surface of the epitaxial Si layer surface.

The first monocrystalline Si substrate was used repeatedly for the same use after removal of the remaining porous Si.

What is claimed is:

1. A process for producing a semiconductor substrate comprising the steps of:
   forming a nonporous monocrystalline semiconductor layer on a first substrate wherein the first substrate comprises a porous layer at the surface thereof;
   bonding a second substrate to the nonporous monocrystalline layer;
   separating the bonded substrate such that a portion of the porous layer remains on the second substrate and a portion of the porous layer is not removed from the first substrate;
   removing the portion of the porous layer on the second substrate; and
   removing the portion of the porous layer remaining on the first substrate.

2. A process for producing a semiconductor substrate, comprising the steps of:
   forming a nonporous monocrystalline semiconductor layer on a first substrate wherein the first substrate comprises a porous layer at the surface thereof;
   bonding a second substrate to the nonporous monocrystalline layer with interposition of an insulative layer;
   separating the bonded substrates such that a portion of the porous layer remains on the second substrate and a portion of the porous layer is not removed from the first substrate;
   removing the portion of the porous layer on the second substrate; and
   removing the portion of the porous layer remaining on the first substrate.

3. The process according to claim 1 or 2, wherein the porous layer is formed of silicon.

4. The process according to claim 1 or 2, wherein after removing the porous layer from the separated first substrate, a new porous layer is formed on the first substrate, and is employed repeatedly as the first substrate in the forming step of the nonporous monocrystalline semiconductor layer and subsequent steps.

5. The process according to claim 1 or 2, wherein the nonporous crystalline semiconductor layer is an Si layer.

6. The process according to claim 1 or 2, wherein the nonporous crystalline semiconductor layer is a compound semiconductor layer.

7. The process according to claim 1 or 2, wherein the first substrate is Si.

8. The process according to claim 1 or 2, wherein the second substrate is light-transmissive.

9. The process according to claim 1 or 2, wherein either of the steps of removing the porous layer is conducted by etching.

10. The process according to claim 1 or 2, wherein either of the steps of removing the porous layer is conducted by selective grinding of the porous layer by employing the nonporous monocrystalline semiconductor layer as a stopper.

11. The process according to claim 1 or 2, wherein the step of separating the bonded substrates at the porous layer is conducted by at least one of methods of application of a compression force to the substrate in a direction perpendicular to the bonding face of the substrate, application of a pulling force to the substrate in a direction perpendicular to the bonding face of the substrate, and application of a shear stress to the bonding face.

12. The process according to claim 2, wherein the insulative layer is formed on at least one of the nonporous monocrystalline layer and the surface of the second substrate.

13. The process according to claim 12, wherein the insulative layer is selected from thermal oxidation films, deposited SiO$_2$ films, and deposited Si$_3$N$_4$ films.

14. The process according to claim 1 or 2, wherein the step of bonding is conducted by one or more of the methods of anode coupling, compression, and heat treatment.

15. The process according to claim 1 or 2, wherein the porous layer is formed by anodization.

16. The process according to claim 15, wherein the anodization is conducted in an HF solution.

17. The process according to claim 1 or 2, wherein the step of separating the substrates at the porous layer is conducted by application of a wave energy.

18. The process according to claim 1 or 2, wherein the step of separating the substrates at the porous layer is conducted by inserting a separation member from an edge face of the porous layer thereinto.

19. The process according to claim 1 or 2, wherein the step of separating the substrates at the porous layer is conducted by expansion energy of a material impregnated into the porous layer.

20. The process according to claim 1 or 2, wherein the step of separating the substrates at the porous layer is conducted by selective etching at the edge face of the wafer.

21. The process according to claim 1 or 2, wherein the porosity of the porous layer ranges from 10 to 80%.

22. The process according to claim 15, wherein the current density is increased in stages when said anodization is carried out.

23. The process according to claim 15, wherein the porosity of the porous layer is varied when said anodization is carried out.

24. The process according to claim 23, wherein the variation of the porosity is carried out in stages.

* * * * *